US009466368B2

(12) United States Patent
Hyde et al.

(10) Patent No.: US 9,466,368 B2
(45) Date of Patent: Oct. 11, 2016

(54) CONNECTIBLE NANOTUBE CIRCUIT

(75) Inventors: Roderick A. Hyde, Livermore, CA (US); Muriel Y. Ishikawa, Livermore, CA (US); Nathan P. Myhrvold, Medina, WA (US); Clarence T. Tegreene, Bellevue, WA (US); Charles Whitmer, North Bend, WA (US); Lowell L. Wood, Jr., Livermore, CA (US)

(73) Assignee: DEEP SCIENCE, LLC, Bellevue, WA (US)

( * ) Notice: Subject to any disclaimer, the term of this patent is extended or adjusted under 35 U.S.C. 154(b) by 2469 days.

(21) Appl. No.: 12/229,994

(22) Filed: Aug. 27, 2008

(65) Prior Publication Data

US 2009/0007422 A1    Jan. 8, 2009

Related U.S. Application Data

(60) Division of application No. 11/314,718, filed on Dec. 20, 2005, now Pat. No. 7,696,505, and a continuation-in-part of application No. 11/314,738, filed on Dec. 20, 2005, now Pat. No. 7,786,465, and a continuation-in-part of application No. 11/314,751, filed on Dec. 20, 2005, now Pat. No. 7,721,242.

(51) Int. Cl.
| | |
|---|---|
| *G11C 13/02* | (2006.01) |
| *B82Y 10/00* | (2011.01) |
| *G11C 17/16* | (2006.01) |
| *H01L 27/28* | (2006.01) |
| *H01L 51/00* | (2006.01) |

(52) U.S. Cl.
CPC .............. *G11C 13/025* (2013.01); *B82Y 10/00* (2013.01); *G11C 17/16* (2013.01); *G11C 2213/77* (2013.01); *G11C 2213/81* (2013.01); *H01L 27/285* (2013.01); *H01L 51/0048* (2013.01); *Y10S 977/75* (2013.01); *Y10S 977/842* (2013.01); *Y10T 29/49117* (2015.01)

(58) Field of Classification Search
CPC ............................. G11C 13/025; B82Y 10/00
USPC ......... 29/846, 850, 842, 868; 257/4, E51.04; 423/447.1; 438/128, 800; 977/842, 750
See application file for complete search history.

(56) References Cited

U.S. PATENT DOCUMENTS

| | | | |
|---|---|---|---|
| 4,581,315 A | 4/1986 | Garito | |
| 6,239,547 B1 | 5/2001 | Uemura et al. | |
| 6,781,166 B2 | 8/2004 | Lieber et al. | |
| 6,897,009 B2 * | 5/2005 | Johnson et al. | 430/315 |
| 6,963,077 B2 | 11/2005 | DeHon et al. | |
| 2002/0122765 A1 | 9/2002 | Horiuchi et al. | |
| 2002/0130353 A1* | 9/2002 | Lieber et al. | 257/315 |
| 2003/0089899 A1 | 5/2003 | Lieber et al. | |
| 2003/0165418 A1 | 9/2003 | Ajayan et al. | |
| 2004/0013597 A1 | 1/2004 | Mao et al. | |

(Continued)

OTHER PUBLICATIONS

Schottky Diode, http://www.mpulsemw.com/SchottkyDiode.htm, accessed Jul. 17, 2012.*

(Continued)

*Primary Examiner* — Livius R Cazan
(74) *Attorney, Agent, or Firm* — Daniel J. Honz; Advent, LLP

(57) ABSTRACT

Carbon nanotube template arrays may be edited to form connections between proximate nanotubes and/or to delete undesired nanotubes or nanotube junctions.

31 Claims, 3 Drawing Sheets

(56) References Cited

U.S. PATENT DOCUMENTS

| | | |
|---|---|---|
| 2004/0026007 A1 | 2/2004 | Hubert et al. |
| 2004/0126304 A1 | 7/2004 | Zhao |
| 2004/0129447 A1 | 7/2004 | Beeli et al. |
| 2005/0112051 A1 | 5/2005 | Liu et al. |
| 2005/0117441 A1 | 6/2005 | Lieber et al. |
| 2005/0238566 A1 | 10/2005 | Rao et al. |
| 2005/0253137 A1 | 11/2005 | Whang et al. |
| 2007/0004191 A1 | 1/2007 | Gu et al. |
| 2008/0017845 A1 | 1/2008 | Drndic et al. |

OTHER PUBLICATIONS

Buldum, A. et al.; "Contact resistance between carbon nanotubes"; Physical Review B; 2001; pp. 1-4; vol. 63 ; No. 161403(R); The American Physical Society.

Derycke, V. et al.; "Carbon Nanotube Inter- and Intramolecular Logic Gates"; Nano Letters, bearing a date of Aug. 16, 2001; pp. 453-456; vol. 1, No. 9; American Chemcial Society.

Fuhrer, M. S. et al.; "Transport through crossed nanotubes"; Physica E; 2000; pp. 868-871; vol. 6; Elsevier Science B. V.

Jung, Y. et al.; "Mechanism of Selective Grown of Carbon Nanotubes on $SiO_2$/Si Patterns"; Nano Letters; 2003; pp. 561-564; vol. 3; No. 4; American Chemical Society.

Krasheninnikov, A. V. et al.; "Ion-irradiation-induced welding of carbon nanotubes"; Physical Review B.; 2002; 6 pages; vol. 66; No. 245403; The American Physical Society.

Patwardhan, J. et al.; "Circuit and System Architecture for DNA-Guided Self-Assembly of Nanoelectronics"; Appears in Proceedings of Foundations of Nanoscience; 2004; 15 pages; Science Technica.

Srivastava, D. et al.; "Computational Nanotechnology with Carbon Nanotubes and Fullerenes"; Computing in Science and Engineering: Jul./Aug. 2001; pp. 42-55; IEEE.

Terrones, M. et al.; "Molecular Junctions by Joining Single-Walled Carbon Nanotubes"; Physical Review Letters; Aug. 12, 2002; 4 pages; vol. 89; No. 7; The American Physical Society.

Yao, Z. et al. ;"Carbon nanotube intramolecular junctions"; Nature; Nov. 18, 1999; pp. 273-276; vol. 402; Macmillan Magazines Ltd.

Collins, Philip G. et al.; "Engineering Carbon Nanotubes and Nanotube Circuits Using Electrical Breakdown"; Science; bearing a date of Apr. 27, 2001; pp. 706-709; vol. 292; American Association for the Advancement of Science.

UK Intellectual Property Office Examination Report Under Section 18(3); App. No. GB0812771.4; Jul. 16, 2010; pp. 1-3.

Bachtold, Adrian; Hadley, Peter; Nakanishi, Takeshi; Dekker, Cees; "Logic Circuits with Carbon Nanotube Transistors"; Science; Nov. 2001; pp. 1317-1320; vol. 294.

Dehon, Andre; "Array-Based Architecture for FET-Based, Nanoscale Electronics"; IEEE Transactions on Nanotechnology; Mar. 2003; pp. 23-32; vol. 2, No. 1.

Dwyer, Chris; Guthold, Martin; Falvo, Michael; Washburn, Sean; Superfine, Richard; Erie, Dorothy; "DNA-functionalized single-walled carbon nanotubes"; Nanotechnology; 2002; pp. 601-604; vol. 13; Institute of Physics Publishing.

Dwyer, Chris; Vicci, Leandra; Poulton, John; Erie, Dorothy; Superfine, Richard; Washburn, Sean; Taylor, II, Russell M.; "The Design of DNA Self-Assembled Computing Circuitry"; IEEE Transactions on VLSI; Nov. 2004; pp. 1214-1220; vol. 12, No. 11.

Fu, Qiang; Lu, Chenguang; Liu, Jie; "Selective Coating of Single Wall Carbon Nanotubes with Thin $SiO2$ Layer"; Nano Letters; 2002; pp. 329-332; vol. 2, No. 4.

Fuhrer, M.S.; Nygard, J.; Shih, L.; Forero, M.; Yoon, Young-Gui; Mazzoni, M.S.C.; Choi, Hyoung Joon; Ihm, Jisoon; Louie, Steven G.; Zettl, A.; McEuen, Paul L.; "Crossed Nanotube Junctions"; Science; Apr. 2000; pp. 494-497; vol. 288.

Guan, Jingjiao; Lee, L. James; "Generating highly ordered DNA nanostrand arrays"; PNAS; bearing dates of Aug. 10, 2005, Nov. 2, 2005 and Dec. 20, 2005; pp. 18321-18325; vol. 102, No. 51; located at www.pnas.org_cgi_doi_10.1073_pnas.0506902102.

Kuekes, Philip J.; Snider, Gregory S.; Williams, R. Stanley; "Nanocomputers Crossbar; Crisscrossing assemblies of defect-prone nanowires could succeed today's silicon-based circuits"; Scientific American; Nov. 2005; pp. 72-80; vol. 293, No. 5.

Liu, Dage; Reif, John H.; Labean, Thomas H.; "DNA Nanotubes: Construction and Characterization of Filaments Composed of TX-tile Lattice"; In the $8^{th}$ International Meeting on DNA Based Computers (DNA 8), Sapparo, Japan; Jun. 2002; pp. 1-13.

Lustig, Steven R.; Boyes, Edward D.; French, Roger H.; Gierke, Timothy D.; Harmer, Mark A.; Hietpas, Paula B.; Jagota, Anand; McLean, R. Scott; Mitchell, Greg P.; Onoa, G. Bibiana; Sams, Kerry D.; "Lithographically Cut Single-Walled Carbon Nanotubes: Controlling Length Distribution and Introducing End-Group Functionality"; Nano Letters; 2003; pp. 1007-1012; vol. 3, No. 8.

Papadopoulos, C; Rakitin, A.; Li, J.; Vedeneev, A.S.; Xu, J.M.; "Electronic Transport in Y-Junction Carbon Nanotubes"; Physical Review Letters; Oct. 16, 2000; pp. 3476-3479; vol. 85, No. 16; The American Physical Society.

Tans, Sander J.; Verschueren, Alwin R.M.; Dekker, Cees; "Room-temperature transistor based on a single carbon nanotube"; Nature; 1998; pp. 49-52; vol. 393.

Yan, Hao; Park, Sung Ha; Finkelstein, Gleb; Reif, John H.; Labean, Thomas H.; "DNA-Templated Self-Assembly of Protein Arrays and Highly Conductive Nanowires"; Science; Sep. 2003; pp. 1882-1884; vol. 301.

Zheng, Ming; Jagota, Anand; Strano, Michael S.; Santos, Adelina P.; Barone, Paul; Chou, S. Grace; Diner, Bruce A.; Dresselhaus, Mildred S.; McLean, Robert S.; Onoa, G. Bibiana; Samsonidze, Georgii G.; Semke, Ellen D.; Usrey, Monica; Walls, Dennis J.; "Structure-Based Carbon Nanotube Sorting by Sequence-Dependent DNA Assembly"; Science; Nov. 2003; pp. 1545-1548; vol. 302.

UK Intellectual Property Office Examination Report Under Section 18(3); App. No. GB0812771.4; Dec. 10, 2010; pp. 1-3.

UK Intellectual Property Office Examination Report under Section 18(3); App. No. GB0812771.4; Mar. 17, 2011.

PCT International Search Report; International App. No. PCT/US 06/48212, Oct. 31, 2008; pp. 1-2.

UK Intellectual Property Office Examination Report Under Section 18(3); App. No. GB0812771.4; Jun. 22, 2011; pp. 1-3.

* cited by examiner

CONNECTIBLE NANOTUBE CIRCUIT

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a divisional of U.S. patent application Ser. No. 11/314,718, now U.S. Pat. No. 7,696,505, entitled CONNECTIBLE NANOTUBE CIRCUIT, naming Roderick A. Hyde, Muriel Y. Ishikawa, Nathan P. Myhrvold, Clarence T. Tegreene, Charles Whitmer, and Lowell L. Wood, Jr., as inventors, filed 20 Dec. 2005.

For purposes of the USPTO extra-statutory requirements, the present application constitutes a continuation-in-part of U.S. patent application Ser. No. 11/314,738, now U.S. Pat. No. 7,786,465, entitled DELETABLE NANOTUBE CIRCUIT, naming Roderick A. Hyde, Muriel Y. Ishikawa, Nathan P. Myhrvold, Clarence T. Tegreene, Charles Whitmer, and Lowell L. Wood, Jr. as inventors, filed 20 Dec. 2005.

For purposes of the USPTO extra-statutory requirements, the present application constitutes a continuation-in-part of U.S. patent application Ser. No. 11/314,751, now U.S. Pat. No. 7,721,242, entitled NANOTUBE CIRCUIT ANALYSIS SYSTEM AND METHOD, naming Roderick A. Hyde, Muriel Y. Ishikawa, Nathan P. Myhrvold, Clarence T. Tegreene, Charles Whitmer, and Lowell L. Wood, Jr. as inventors, filed 20 Dec. 2005.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003. The present applicant entity has provided above a specific reference to the application(s) from which priority is being claimed as recited by statute. Applicant entity understands the statute is unambiguous in its specific reference language and does not require either a serial number or any characterization, such as "continuation" or "continuation-in-part," for claiming priority to U.S. patent applications. Notwithstanding the foregoing, applicant entity understands that the USPTO's computer programs have certain data entry requirements, and hence applicant entity is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

BACKGROUND

According to the International Technology Roadmap for Semiconductors (ITRS), device sizes will continue to shrink, roughly in accordance with Moore's Law (which predicts a doubling of the number of transistors per unit area every 1.5-2 years). As device size requirements grow ever more stringent, traditional silicon lithography techniques may become inadequate, requiring a shift in materials and/or in circuit design techniques to keep pace with demands for improved performance.

SUMMARY

In one aspect, a method of constructing a carbon nanotube circuit comprises creating a junction in a template structure. The template structure includes a first array of substantially parallel carbon nanotubes, a second array of substantially parallel carbon nanotubes at an angle to the first array (e.g., a right angle), and an intermediate layer interposed between the two arrays of carbon nanotubes. Creating the junction includes coupling a first selected carbon nanotube from the first array to a second selected carbon nanotube from the second array. The created junction may exhibit a linear or a nonlinear current-voltage response. Joining the first and second selected carbon nanotubes may include selectively removing a portion of the intermediate layer, for example by applying a voltage, exposing a resist composition (e.g., with electromagnetic radiation, an electron beam, or an ion beam), or illuminating the intermediate layer with an electron beam, ion beam, or electromagnetic radiation such as a laser beam. The first and second selected carbon nanotubes may be selected based upon a predicted electrical property of their formed junction. Coupling the first and second selected carbon nanotubes may include physical coupling, providing a preferential path for electrical energy transfer, and/or providing a preferential path for electromagnetic interaction. Either or both of the first and second selected carbon nanotubes may independently be selected to be semiconducting or metallic. The method may further include measuring an electrical or physical property (e.g., location, size, defect location, and/or chemical environment) of the created junction, and additionally may include using the measured property to select additional carbon nanotubes for connection or deletion. The method may further include determining the atomic registration of the first selected carbon nanotube relative to the second selected carbon nanotube or to the intermediate layer.

In another aspect, a carbon nanotube circuit template comprises a plurality of carbon nanotubes, including a first selected carbon nanotube, a second selected carbon nanotube, and a removable intermediate layer interposed between the first and second selected carbon nanotubes. The template is characterized in that the first and second selected carbon nanotubes join to create a junction upon removal of the removable intermediate layer. Such removal may be by a process including exposure to electromagnetic radiation, an electron beam, and/or an ion beam, and optionally exposure to a developer composition. Either or both of the first and second selected carbon nanotubes may independently be selected to be semiconducting or metallic. The first and second carbon nanotubes may be positioned at a substantially right angle to one another. The created junction may exhibit a linear or a nonlinear current-voltage response.

DETAILED DESCRIPTION

Figure 1:
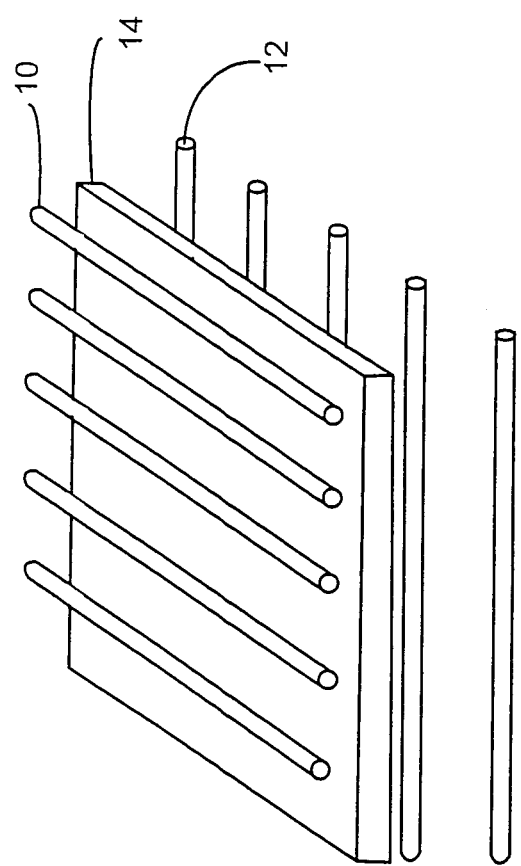
FIG. 1 is a schematic of a template device.

Carbon nanotubes represent an attractive candidate material for dramatically reducing device sizes. They have been shown to exhibit diode-like properties when "kinks" (pentagon-heptagon defect pairs) are introduced (see, e.g., Yao et al., "Carbon nanotube intramolecular junctions," *Nature* 402:273-276 (November 1999), incorporated by reference herein), and crossed nanotubes may act as nanoscale p-type Schottky diodes (see, e.g., Fuhrer, et al., "Transport through crossed nanotubes," *Physica E* 6:868-871 (2000), hereinafter referred to as "Fuhrer I," Fuhrer, et al., "Crossed Nanotube Junctions," *Science* 288:494-497 (April 2000), hereinafter referred to as "Fuhrer II," and Patwardhan, et al., "Circuit and System Architecture for DNA-Guided Self-Assembly of Nanoelectronics," *Proc. 1st Conf. Foundations of Nanosci.* 344-358 (April 2004), all of which are incorporated herein by reference).

Single-walled carbon nanotubes (SWCNTs) may be metallic or semiconducting depending on their chirality. Individual SWCNTs have a chirality defined by circumferential vector (n,m) in terms of graphite lattice units. When (n−m)/3 is an integer, the SWCNTs generally behave as metals, while other SWCNTs generally behave as semiconductors. Fuhrer II found three types of behavior for crossed SWCNTs, depending on whether the constituent CNTs were metallic-metallic (MM), semiconducting-semiconducting (SS), or metallic-semiconducting (MS). MM junctions and SS junctions exhibited roughly linear I-V behavior, with MM conductivities in the range of 0.086-0.26 $e^2/h$ and SS conductivities in the range of at least 0.011-0.06 $e^2/h$. MS junctions exhibited nonlinear I-V behavior, with much lower conductivities in the linear range and with a Schottky barrier of 190-290 meV. Theoretical calculations (see, e.g., Buldum, el al., "Contact resistance between carbon nanotubes," *Phys. Rev. B* 63:161403 (R) (April 2001), incorporated herein by reference) suggest that the conductivity of such junctions may be a sensitive function of atomic structure in the contact region (e.g., registration of hexagon structures in adjacent nanotubes).

CNTs may also be fabricated in a Y-shape, in which three nanotubes converge at a junction (see, e.g., Papadapoulos "Electronic Transport in Y-Junction Carbon Nanotubes," *Phys. Rev. Lett.* 85(16):3476-3479, incorporated herein by reference). Such systems (and the special subset of T-shaped junctions) have been computationally modeled and found to exhibit current rectification (see, e.g., Srivastava, et al., "Computational Nanotechnology with Carbon Nanotubes and Fullerenes," *Comp. Sci. Eng.* 3(4):42-55 (July/August 2001), incorporated herein by reference). Experimental results (Papadapoulos, supra) confirm rectifying behavior.

The rectifying structures described above may be combined to form more complex circuit elements (e.g., logic gates, such as those described in Derycke, et al., "Carbon Nanotube Inter- and Intramolecular Logic Gates," *Nano Lett.*, 1(9):453-456 (August 2001), incorporated herein by reference) and circuits (e.g., a scalable one-bit adder, described in Patwardhan, supra), using conventional circuit design principles.

As shown in FIG. 1, a template device comprises two arrays of CNTs 10, 12 set at an angle to one another (90 degrees as shown, but other angles may also be used). An intermediate layer 14 is interposed between the two arrays of CNTs. (FIG. 1 is shown in exploded view for clarity; in most embodiments, the CNTs 10, 12 will be in contact or at least in close proximity to intermediate layer 14.) As shown, the intermediate layer 14 is a flat layer, but in other embodiments, it may be a coating on the CNTs or have any other physical configuration that interposes it between CNTs of the two arrays. The CNTs of each array may be metallic, semiconducting, or a mixture of both types. In the configuration shown in FIG. 1, the CNTs of the first array 10 are insulated from the CNTs of the second array 12 by the intermediate layer.

Figure 2:
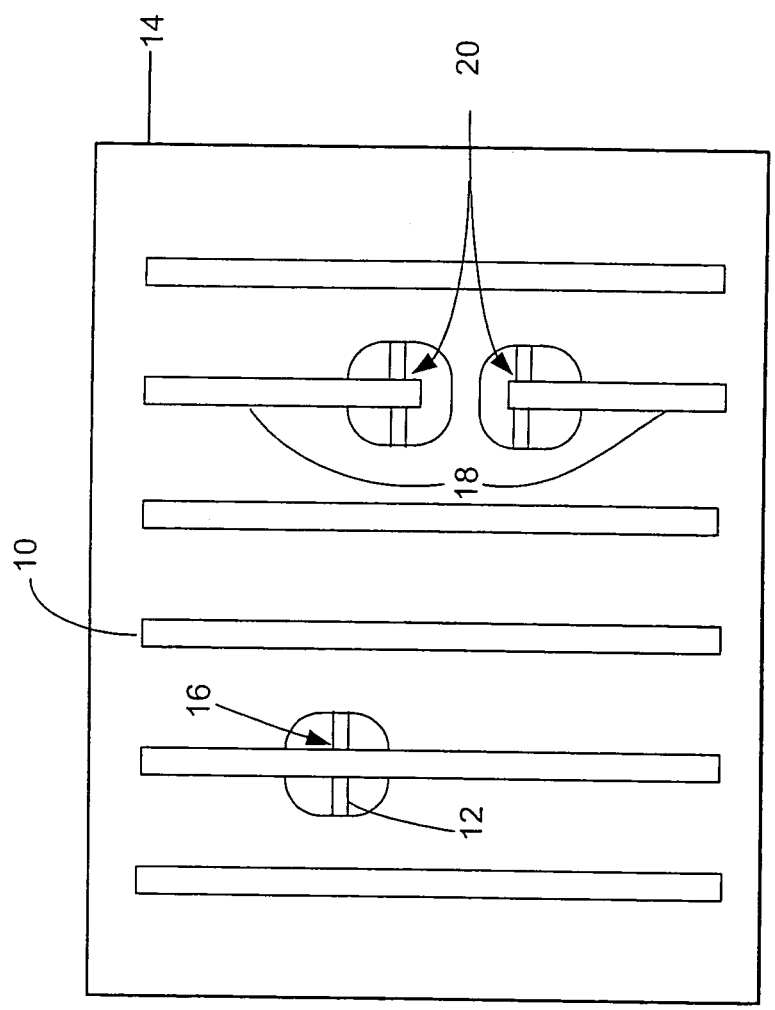
FIG. 2 is a schematic of the template device of FIG. 1 after selective editing.

FIG. 2 shows a plan view of the template device of FIG. 1 after selective editing of the intermediate layer 14. As seen at junction 16, the intermediate layer is removed, allowing a CNT of the first array 10 and a CNT of the second array 12 to contact one another to form a junction. In addition, segment of CNT 18 has been removed between two additional junctions 20. In some embodiments, segments or junctions may be removed by an electron beam, ion beam, and/or a laser beam, either by direct etching or by illumination followed by a chemical development process. In other embodiments, segments or junctions may be removed by application of a voltage, for example by application of one or more timed pulses along the CNTs that are selected to temporally overlap at a common center, or by application of a voltage directly to a junction or segment. By selecting junctions at which the CNTs may be connected and segments or junctions in which they may be removed, complex circuits of CNTs can be built up in the template. In other embodiments, additional intermediate layers and CNT arrays may be added to increase the available complexity.

The intermediate layer 14 may comprise any material that serves to separate the CNTs and that can be selectively removed or deactivated. In some embodiments, the intermediate layer may comprise a resist composition, which may be removed by conventional lithographic techniques (including but not limited to photoresist, e-beam resist, or X-ray resist). In other embodiments, the resist may comprise a material that can be locally removed or deactivated by application of a voltage between the first selected CNT and the second CNT, potentially obviating the need for lithographic systems.

The arrays of CNTs 10 and 12 may be formed by a variety of methods, including but not limited to pick-and-place, self-assembly of already-formed CNTs (e.g., by the methods of Dwyer, et al., "The Design of DNA Self-Assembled Computing Circuitry," *IEEE Trans. VLSI Sys.*, 12(11):1214-1220 (November 2004), incorporated herein by reference), or in situ growth of CNTs (e.g., by the methods of Jung, et al., "Mechanism of Selective Growth of Carbon Nanotubes on $SiO_2$/Si Patterns," *Nano Lett.* 3(4):561-564 (March 2003), incorporated herein by reference). Some of these methods may lend themselves to production of CNTs having particular chiralities and/or conductivities, while others may produce arrays of CNTs having a distribution of chiralities and/or conductivities.

In embodiments where the chiralities and/or conductivities are not known a priori, it may be desirable to interrogate the material properties of individual CNTs in order to determine appropriate connections and/or deletions (e.g., by electrical testing, plasmon interactions, optical testing, atomic force microscopy, and/or other types of microscopy).

In still other embodiments, it may be desirable to interrogate properties of individual CNTs or of groups of CNTs to locate regions having desired properties after some or all of the connections and/or deletions have been made. In yet other embodiments, it may be desirable to examine physical properties, as well as or instead of electrical properties, of CNTs and junction during any point in the process to determine additional connections and/or deletions or other configurational aspects. Physical properties may include, but are not limited to, location, size, defect location, and/or chemical environment.

Figure 3:
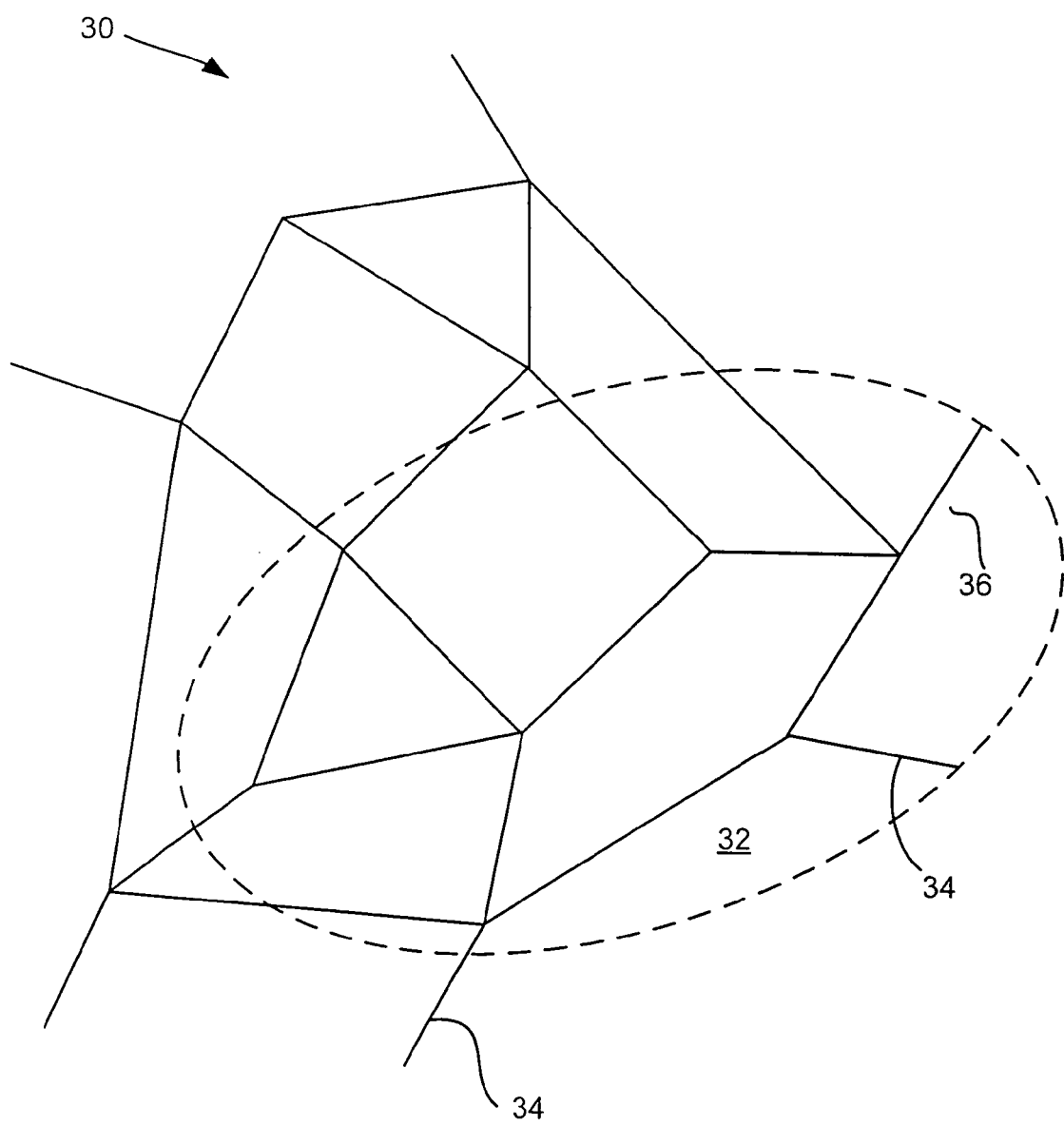
FIG. 3 is a schematic of an interconnected set of carbon nanotubes (CNTs).

FIG. 3 shows an interconnected set of CNTs including Y junctions 30. Such an interconnected set may be produced, for example, by welding of long nanotubes (see, e.g., Terrones, et al., "Molecular Junctions by Joining Single-Walled Carbon Nanotubes," *Phys. Rev. Lett.* 89(7):075505 (August 2002), and Krasheninnikov, et al., "Ion-irradiation induced welding of carbon nanotubes," *Phys. Rev. B*, 66:245403 (2002), both of which are incorporated herein by reference). Arrays of Y-branched CNTs have also been produced by Papadopoulos, supra; these can be interconnected by similar techniques, or by the selective interconnection technique illustrated in FIGS. 1 and 2. In some embodiments, production of such interconnected sets of CNTs may be effectively random, while in other embodiments, CNTs may be interconnected in a predictable pattern.

In either case, sections 32 of the interconnected set 30 may be determined to act as logic gates or other desired circuit elements or circuits. In some embodiments, such sections may be located by determination of the chirality and/or conductivity of individual segments within the interconnected set by empirically determining the electrical properties of a interconnected set through application of voltages to selected "input" CNTs 34 and measurement of selected "output" CNTs 36, or by a combination of these methods (e.g., by determining chirality of selected "input" and "output" CNTs, identifying interconnecting junctions between them, and applying signals to the CNTs to determine behavior of the set of input CNTs, output CNTs, and interconnecting junctions). In some embodiments, segments or junctions of the interconnected set 30 may be deleted as discussed above. Such deletion may occur before, during, or after any measurement of properties of the interconnected set.

In a large interconnected set 30, many sections 32 having desired circuit properties may be present (either by design and controlled self-assembly, or by chance). Once identified as discussed above, these sections may be isolated from the interconnected set, either physically (by cutting junctions outside the desired section and moving it to a desired location), or effectively, by disconnecting segments of junctions not in the desired section to leave only continuous CNTs (which may function as leads) connected to the desired section inputs and outputs.

In some embodiments, template structures such as those shown in FIGS. 1 and 3 may be constructed in bulk, and then individually edited to form custom circuits. In such embodiments (and in particular in embodiments in which the chiralities and/or conductivities of individual CNTs are not known a priori), the determination of which CNT sections to connect and/or delete may be made using customized software.

In some embodiments, the customized software accesses a model of a CNT template structure (using measurements of properties of CNTs in the particular template if appropriate) and identifies the effect of editing the CNT template structure, either by deleting segments or junctions, or by forming connections between segments in physical proximity. The model includes the electrical behavior of the CNT segments and junctions of the template (e.g., the rectifying properties or lack thereof of individual junctions, and/or the conductivities of the CNT segments).

In some embodiments, the customized software may determine circuit behavior from first principles. In other embodiments, the software may store schematics for building block structures (including by way of nonlimiting example the logic gates and adders discussed above), and allow circuit designers to specify circuit designs using conventional methods. The software then locates regions within the model of the template structure that could be modified as discussed above to implement the particular designs. In some embodiments, a computer-based system may then control the application of voltages, dynamic masks, serial e-beam etchers, or whatever other editing tools were appropriate to produce the desired circuit on a particular template structure.

Those having skill in the art will recognize that the state of the art of circuit design has progressed to the point where there is typically little distinction left between hardware and software implementations of aspects of systems. The use of hardware or software is generally a design choice representing tradeoffs between cost, efficiency, flexibility, and other implementation considerations. Those having skill in the art will appreciate that there are various vehicles by which processes, systems and/or other technologies involving the use of logic and/or circuits can be effected (e.g., hardware, software, and/or firmware, potentially including CNT-based circuits in whole or in part), and that the preferred vehicle will vary with the context in which the processes, systems and/or other technologies are deployed. For example, if an implementer determines that speed is paramount, the implementer may opt for a mainly hardware and/or firmware vehicle. Alternatively, if flexibility is paramount, the implementer may opt for a mainly software implementation. In these or other situations, the implementer may also opt for some combination of hardware, software, and/or firmware, potentially including CNT-based circuits in whole or in part. Hence, there are several possible vehicles by which the processes, devices and/or other technologies involving logic and/or circuits described herein may be effected, none of which is inherently superior to the other. Those skilled in the art will recognize that optical aspects of implementations may require optically-oriented hardware, software, and or firmware.

Other embodiments of the invention will be apparent to those skilled in the art from a consideration of the specification or practice of the invention disclosed herein. It is intended that the specification be considered as exemplary only, with the true scope and spirit of the invention being indicated by the following claims.

What is claimed is:

1. A method of constructing a carbon nanotube (CNT) circuit, comprising:
   creating a junction in a template structure, the template structure including:
   a first array of substantially parallel CNTs;
   a second array of substantially parallel CNTs at an angle to the first array; and
   an intermediate layer interposed between a first selected CNT of the first array and a second selected CNT of the second array;
   wherein creating a junction comprises coupling the first selected CNT and the second selected CNT.

2. The method of claim 1, wherein the created junction exhibits a nonlinear current-voltage response.

3. The method of claim 1, wherein the created junction exhibits a linear current-voltage response.

4. The method of claim 1, wherein joining the first selected CNT and the second selected CNT includes selectively removing a portion of the intermediate layer.

5. The method of claim 4, wherein selectively removing a portion of the intermediate layer comprises:
applying a first voltage to the first selected CNT; and
applying a second voltage to the second selected CNT,
wherein the first and second voltages are of levels selected to combine to remove a portion of the intermediate layer in the vicinity of the first selected CNT and the second selected CNT.

6. The method of claim 4, wherein the intermediate layer comprises a resist composition, and wherein selectively removing a portion of the intermediate layer comprises exposing the resist composition.

7. The method of claim 6, wherein exposing the resist composition comprises illuminating the resist composition with a pattern of electromagnetic radiation.

8. The method of claim 6, wherein exposing the resist composition comprises illuminating the resist composition with an electron beam or ion beam.

9. The method of claim 6, further comprising developing the resist composition.

10. The method of claim 4, wherein selectively removing a portion of the intermediate layer comprises illuminating the intermediate layer with a pattern of electromagnetic radiation.

11. The method of claim 4, wherein selectively removing a portion of the intermediate layer comprises illuminating the intermediate layer with an electron beam or ion beam.

12. The method of claim 1, wherein coupling the first selected CNT and the second selected CNT comprises physically coupling.

13. The method of claim 1, wherein coupling the first selected CNT and the second selected CNT comprises providing a preferential path for electrical energy transfer.

14. The method of claim 1, wherein coupling the first selected CNT and the second selected CNT comprises providing a preferential path for electromagnetic interaction.

15. The method of claim 1, wherein the first selected CNT is metallic.

16. The method of claim 15, wherein the second selected CNT is metallic.

17. The method of claim 15, wherein the second selected CNT is semiconducting.

18. The method of claim 1, wherein the first selected CNT is semiconducting.

19. The method of claim 18, wherein the second selected CNT is metallic.

20. The method of claim 18, wherein the second selected CNT is semiconducting.

21. The method of claim 1, further comprising measuring an electrical property of the created junction.

22. The method of claim 21, further comprising using the measured electrical property to select an additional pair of CNTs for connection, and connecting the additional pair of CNTs.

23. The method of claim 21, further comprising using the measured electrical property to select a CNT segment or a junction for deletion, and deleting the selected CNT segment or junction.

24. The method of claim 1, further comprising measuring a physical property of the created junction.

25. The method of claim 24, further comprising using the measured physical property to select an additional pair of CNTs for connection, and connecting the additional pair of CNTs.

26. The method of claim 24, further comprising using the measured physical property to select a CNT segment or a junction for deletion, and deleting the selected CNT segment or junction.

27. The method of claim 24, wherein the physical property of the created junction is selected from the group consisting of location, size, defect location, and chemical environment.

28. The method of claim 1, further comprising selecting the first selected CNT and the second selected CNT, wherein selecting the first selected CNT and the second selected CNT includes predicting an electrical property of the created junction.

29. The method of claim 1, further comprising determining atomic registration of the first selected CNT relative to the second selected CNT.

30. The method of claim 1, further comprising determining atomic registration of the first selected CNT relative to the intermediate layer.

31. The method of claim 1, wherein the angle is substantially a right angle.

* * * * *